(12) United States Patent
Hafez et al.

(10) Patent No.: US 10,784,378 B2
(45) Date of Patent: Sep. 22, 2020

(54) ULTRA-SCALED FIN PITCH HAVING DUAL GATE DIELECTRICS

(71) Applicant: Intel Corporation, Santa Clara, CA (US)

(72) Inventors: Walid M. Hafez, Portland, OR (US); Roman W. Olac-Vaw, Hillsboro, OR (US); Joodong Park, Portland, OR (US); Chen-Guan Lee, Portland, OR (US); Chia-Hong Jan, Portland, OR (US); Everett S. Cassidy-Comfort, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/318,108

(22) PCT Filed: Sep. 30, 2016

(86) PCT No.: PCT/US2016/054899
§ 371 (c)(1),
(2) Date: Jan. 15, 2019

(87) PCT Pub. No.: WO2018/063366
PCT Pub. Date: Apr. 5, 2018

(65) Prior Publication Data
US 2020/0066897 A1    Feb. 27, 2020

(51) Int. Cl.
*H01L 27/088* (2006.01)
*H01L 29/78* (2006.01)
(Continued)

(52) U.S. Cl.
CPC .......... *H01L 29/785* (2013.01); *H01L 21/845* (2013.01); *H01L 27/1211* (2013.01); *H01L 29/41791* (2013.01); *H01L 29/66795* (2013.01)

(58) Field of Classification Search
CPC ............ H01L 27/0886; H01L 27/0924; H01L 27/1211; H01L 29/41791; H01L 29/66795; H01L 29/7831; H01L 29/785
See application file for complete search history.

(56) References Cited

U.S. PATENT DOCUMENTS

2009/0057765 A1    3/2009  Zhu et al.
2009/0065870 A1    3/2009  Li et al.
(Continued)

OTHER PUBLICATIONS

International Preliminary Report on Patentability for International Patent Application No. PCT/US2016/054899 dated Apr. 11, 2019, 8 pgs.
(Continued)

*Primary Examiner* — Hoai V Pham
(74) *Attorney, Agent, or Firm* — Schwabe, Williamson & Wyatt, P.C.

(57) ABSTRACT

Ultra-scaled fin pitch processes having dual gate dielectrics are described. For example, a semiconductor structure includes first and second semiconductor fins above a substrate. A first gate structure includes a first gate electrode over a top surface and laterally adjacent to sidewalls of the first semiconductor fin, a first gate dielectric layer between the first gate electrode and the first semiconductor fin and along sidewalls of the first gate structure, and a second gate dielectric layer between the first gate electrode and the first gate dielectric layer and along the first gate dielectric layer along the sidewalls of the first gate electrode. A second gate structure includes a second gate electrode over a top surface and laterally adjacent to sidewalls of the second semiconductor fin, and the second gate dielectric layer between the second gate electrode and the second semiconductor fin and along sidewalls of the second gate electrode.

12 Claims, 10 Drawing Sheets

(51) Int. Cl.
  *H01L 21/84* (2006.01)
  *H01L 27/12* (2006.01)
  *H01L 29/417* (2006.01)
  *H01L 29/66* (2006.01)

(56) References Cited

U.S. PATENT DOCUMENTS

2011/0063019 A1   3/2011   Chang et al.
2013/0270620 A1  10/2013   Hu et al.
2014/0001575 A1   1/2014   Adams et al.
2016/0365347 A1*  12/2016  Bao .................. H01L 21/32139

OTHER PUBLICATIONS

International Search Report and Written Opinion for International Patent Application No. PCT/US2016/054899 dated Jun. 21, 2017, 11 pgs.

* cited by examiner

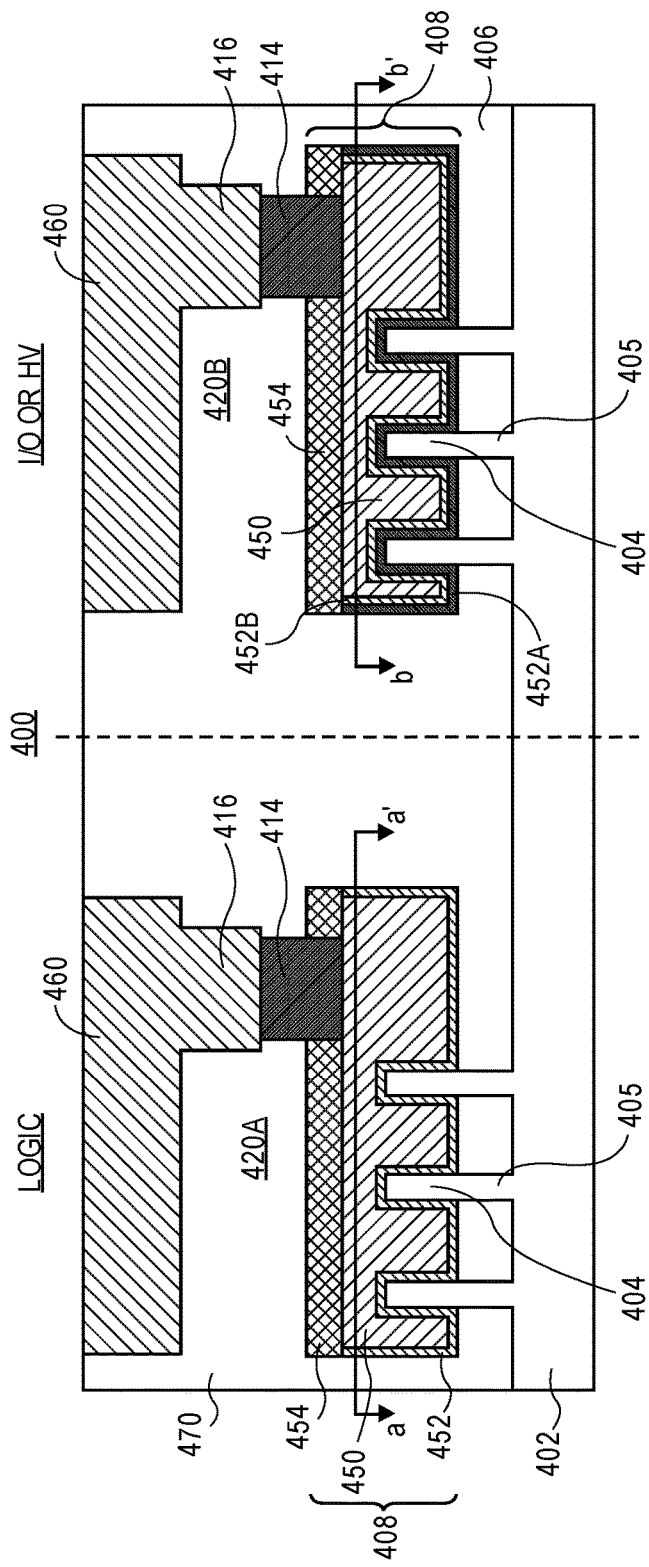
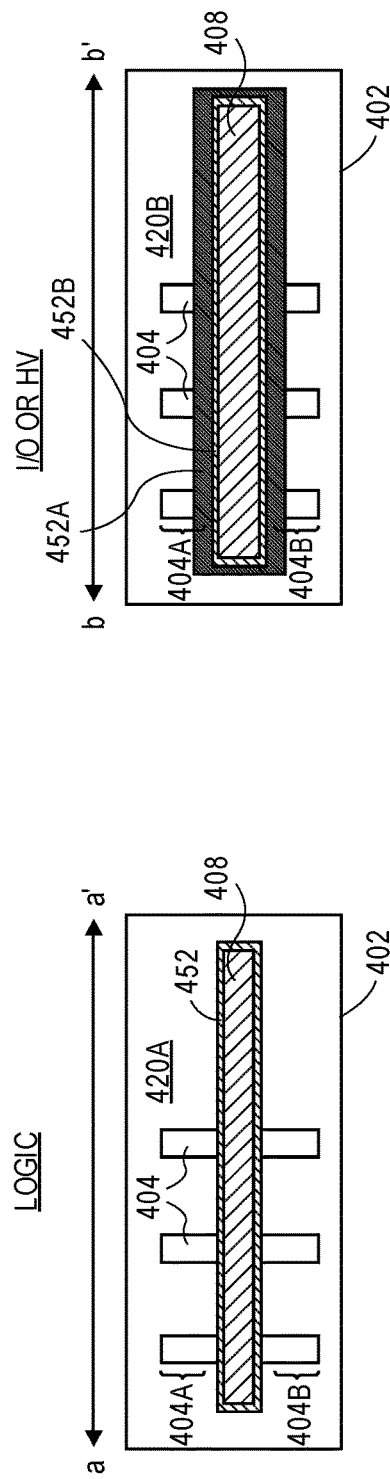
FIG. 4
FIG. 5

ULTRA-SCALED FIN PITCH HAVING DUAL GATE DIELECTRICS

CROSS-REFERENCE TO RELATED APPLICATION

This patent application is a U.S. National Phase Application under 35 U.S.C. § 371 of International Application No. PCT/US2016/054899, filed Sep. 30, 2016, entitled "ULTRA-SCALED FIN PITCH PROCESSES HAVING DUAL GATE DIELECTRICS AND THE RESULTING STRUCTURES," which designates the United States of America, the entire disclosure of which is hereby incorporated by reference in its entirety and for all purposes.

TECHNICAL FIELD

Embodiments of the invention are in the field of semiconductor devices and processing and, in particular, ultra-scaled fin pitch processes having dual gate dielectrics and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In other instances, silicon-on-insulator substrates are preferred because of the improved short-channel behavior of tri-gate transistors.

Scaling multi-gate transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

BRIEF DESCRIPTION OF THE DRAWINGS

FIG. 4 illustrates a cross-sectional view of non-planar semiconductor devices having a dual gate dielectric architecture, in accordance with an embodiment of the present invention.

FIG. 5 illustrates a plan view taken along the a-a' axis of the semiconductor device of FIG. 4 and a plan view taken along the b-b' axis of the semiconductor device of FIG. 4, in accordance with an embodiment of the present invention.

DESCRIPTION OF THE EMBODIMENTS

Figure 1:
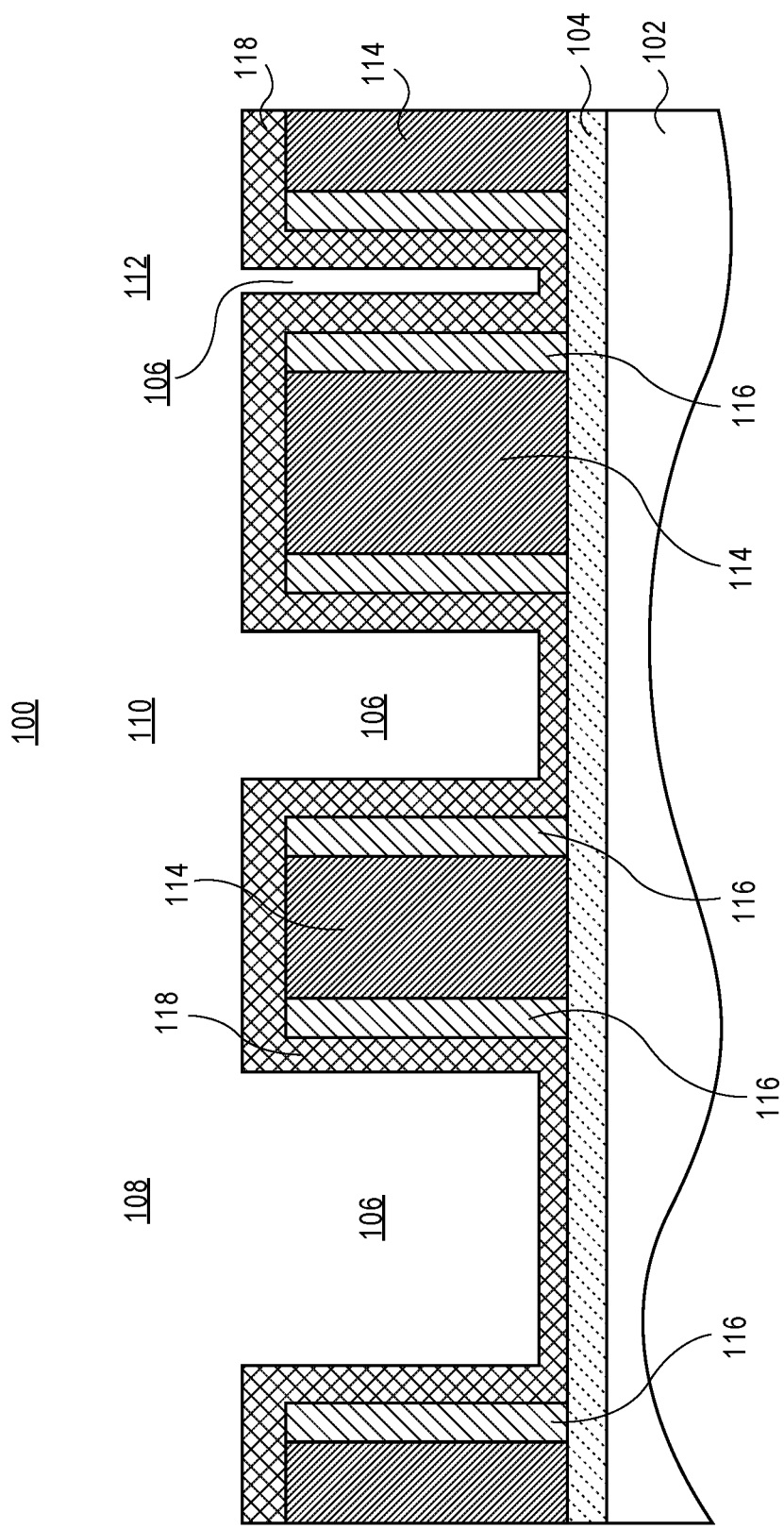
FIG. 1 illustrates a cross-sectional view of a partially fabricated semiconductor structure including trenches of varying width in a replacement gate fabrication scheme, in accordance with an embodiment of the present invention.

Ultra-scaled fin pitch processes having dual gate dielectrics, and the resulting structures, are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments of the present invention are directed to the formation of, or structures including, dielectric liners to enable fabrication of high voltage transistors on aggressively scaled three-dimensional device architectures, such as aggressively scaled fin field-effect transistor (fin-FET) architectures. For example, a process flow fabricated on three-dimensional semiconductor bodies may leave little to no margin for device breakdown. As such, substrate silicon consumption to form a thick gate dielectric layer may no longer be a viable option for forming gate dielectric layers for such high voltage devices. In accordance with one or more embodiments of the present invention, methods of forming dual gate oxides on ultra scaled fin pitch processes, and semiconductor structures having a dual gate dielectric architecture, are described herein. In one such embodiment, a relatively high voltage (HV) or I/O device has one type of gate dielectric architecture, while a co-fabricated relatively low voltage or logic device has another type of gate dielectric architecture different from the gate dielectric architecture of the relatively high voltage or I/O device.

To provide context, system-on-chip (SoC) process technologies often require support of standard logic (e.g., low voltage, thin-oxide) and I/O (e.g., high voltage, thick-oxide) transistors. The distinction between standard logic and HV I/O devices is typically accomplished through a multi-oxide process sequence, where logic transistors receive a thin, high-performance oxide and I/O devices receive a thick oxide capable to sustain higher voltages. As process technologies scale, the logic devices aggressively scale in dimension, creating fabrication challenges with such a dual-oxide structure formation.

In accordance with an embodiment of the present invention, a method of forming a high voltage/dual-gate oxide process on an ultra-scaled finfet transistor architecture is described below. One or more embodiments may address issues surrounding an increasing lack of geometrical space in narrow critical dimension (narrow-CD) logic device to create a defect-free dual oxide process.

It is to be appreciated that prior solutions have relied upon depositing a thick, high-voltage oxide globally, and removing the film from locations where the thin-oxide/logic devices are to be fabricated. However, such a process may be fundamentally incompatible with highly scaled geometries, as the oxide thickness needed to support high voltage operation may fill the logic gate and prevent effective removal. As an example, FIG. 1 illustrates a cross-sectional view of a partially fabricated semiconductor structure including trenches of varying width in a replacement gate fabrication scheme, in accordance with an embodiment of the present invention.

Referring to FIG. 1 a representative structure 100 of partially fabricated devices is formed above a semiconductor layer above or of a common substrate 102. Gate trenches 106 of three different devices regions are shown: an I/O or high voltage gate region 108, an unsealed logic region 110 (e.g., as associated with "previous" technologies), and an aggressively scaled low voltage or logic region 112. The gate trenches 106 of each region 108, 110 and 112 are separated by an inter-layer dielectric (ILD) layer 114. Sidewalls of the trenches 106 may be lined with a dielectric spacer 116.

The representative structure 100 may represent a stage in a processing scheme following a removal portion of a replacement gate process to form the gate trenches 106. A first gate dielectric layer 118, which may be referred to as a high voltage oxide, is formed conformal with the entire structure 100. However, the first gate dielectric layer 118 is ultimately only to be retained in the gate trench 106 of the I/O or high voltage gate region 108, but not in the unsealed logic region 110 or the aggressively scaled low voltage or logic region 112. In an embodiment, removal of the portion of the first gate dielectric layer 118 from the unsealed logic region 110 is straight forward in that a masking and etch process in which the portion of the first gate dielectric layer 118 in the I/O or high voltage gate region 108 is masked and prevented from being etched while the he portion of the first gate dielectric layer 118 from the unsealed logic region 110 is exposed to an etch process is relatively accessible. However, removal of the portion of the first gate dielectric layer 118 from the gate trench 106 in the aggressively scaled low voltage or logic region 112 may not be achievable in such a masking and etch process since the first gate dielectric layer 118 may not be as readily etched in the gate trench 106 of the aggressively scaled low voltage or logic region 112. For example, such narrow spacing may restrict the etch process, leaving unwanted sidewalls or otherwise uncleared material in the gate trench 106 of the aggressively scaled low voltage or logic region 112. In some circumstances, the portion of the first gate dielectric layer 118 from the gate trench 106 in the aggressively scaled low voltage or logic region 112 may pinch-off or effectively fill the trench 106, blocking its removal in an etch process. Subsequent gate formation operations may effectively be shut down in either case. This, aggressively scaled gates may have a reduced ability to accommodate patterning of a high-voltage oxide layer of a dual-gate SoC process.

Addressing one or more of the issues described in association with FIG. 1, one or more embodiments described herein involve the implementations of an easily removable sacrificial hardmask used to fill the narrow logic gates. The high voltage oxide layer is deposited on top of the sacrificial hardmask, as opposed to in the narrow gate trench. Patterning and removal issues described in association with FIG. 1 may then be avoided. Embodiments may be implemented to address a scaling limitation imposed by the state-of-the-art processing which involves filling the logic gates locations with the high voltage oxide and subsequent patterning of the high voltage (HV) oxide to distinguish the high-voltage (wide gate) devices vs standard logic devices. As logic dimensions decrease, an HV oxide deposition may become sufficiently thick as to effectively fill the majority of the logic device. As described above, such a situation may pose a significant challenge to removing the HV oxide from logic device locations.

In an embodiment, a general processing scheme involves use of a sacrificial hardmask to fill logic trenches, formation and patterning of a HV gate dielectric layer, then removal of the sacrificial hardmask, and finally formation of a logic gate dielectric in all gate locations. As an example, FIGS. 2A-2F illustrate cross-sectional views representing various operations in a method of fabricating a semiconductor structure having a dual gate dielectric architecture, in accordance with an embodiment of the present invention.

Figure 2A:
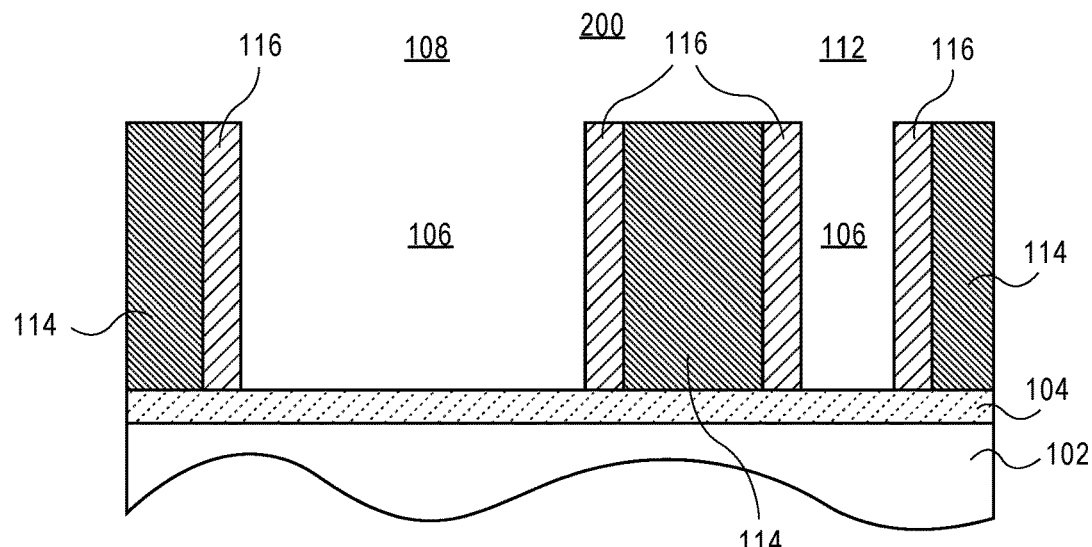
FIGS. 2A-2F illustrate cross-sectional views representing various operations in a method of fabricating a semiconductor structure having a dual gate dielectric architecture, in accordance with an embodiment of the present invention.

Referring to FIG. 2A, a starting structure 200 includes a plurality of gate trenches 106 formed above a semiconductor layer 104 formed above or from a substrate 102. That is, partially fabricated devices are formed above a semiconductor layer above or from a common substrate 102. Gate trenches 106 of two different devices regions are shown: an I/O or high voltage gate region 108 and an aggressively scaled low voltage or logic region 112. The gate trenches 106 of each region 108 and 112 are separated by an inter-layer dielectric (ILD) layer 114. Sidewalls of the trenches 106 are lined with a dielectric spacer 116.

In an embodiment, the starting structure 200 is fabricated by initiating a replacement gate process. For example, a first plurality of dummy gate structures (e.g., in I/O region 108) and a second plurality of dummy gate structures (e.g., in aggressively scaled logic region 112) may be formed above active regions in the semiconductor layer, e.g., formed above first and second pluralities of fin active regions, respectively. Dielectric spacers 116 are formed adjacent the sidewalls of each of such first plurality of dummy gate structures and each of such second plurality of dummy gate structures. The first and second pluralities of dummy gate structures are then removed to form first and second pluralities of gate locations (e.g., gate trenches 106) defined by the spacers 116.

Figure 2B:
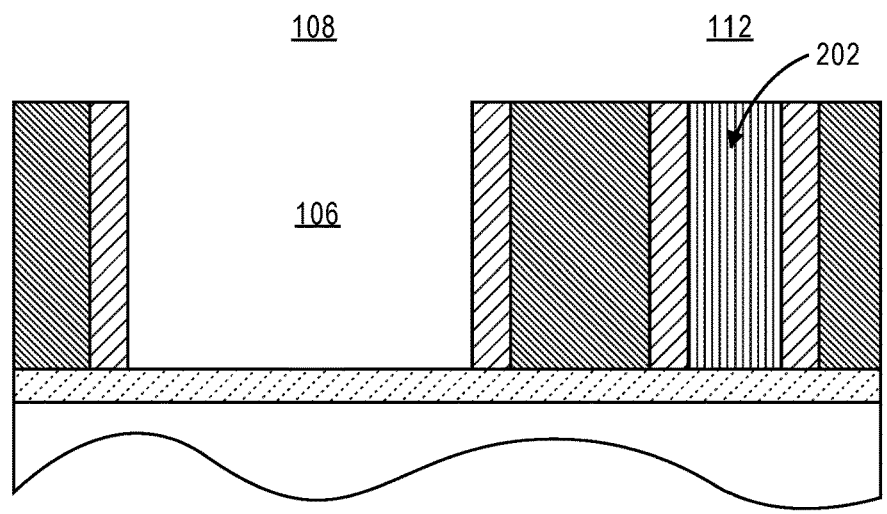

Referring to FIG. 2B, a sacrificial hardmask layer 202 is formed the gate trenches 106 in the logic region 112. In an embodiment, the sacrificial hardmask layer 202 is formed by first forming a blanket material layer on the entire structure of FIG. 2A, e.g., in the gate trenches 106 of both the I/O region 108 and the logic region 112. The portions of the blanket material layer are then removed from the gate trenches 106 of the I/O region 108, e.g., using a masking and etch process. In one such embodiment, the blanket material layer is formed by depositing the blanket material layer by chemical vapor deposition (CVD) process or by a spin-on process. In another embodiment, the sacrificial hardmask layer 202 is formed by selectively growing the sacrificial hardmask layer 202 in the gate trenches of the logic region 112, e.g., by a masking and then selective growth process. In an embodiment, the sacrificial hardmask layer 202 is an insulating layer. In one embodiment, the sacrificial hardmask layer 202 is an ashable material, e.g., a carbon-based material removable using an oxygen plasma ashing process. In an embodiment, the sacrificial hardmask layer 202 is easily removable without damaging the surrounding materials, and can withstand subsequent oxide deposition conditions.

Figure 2C:
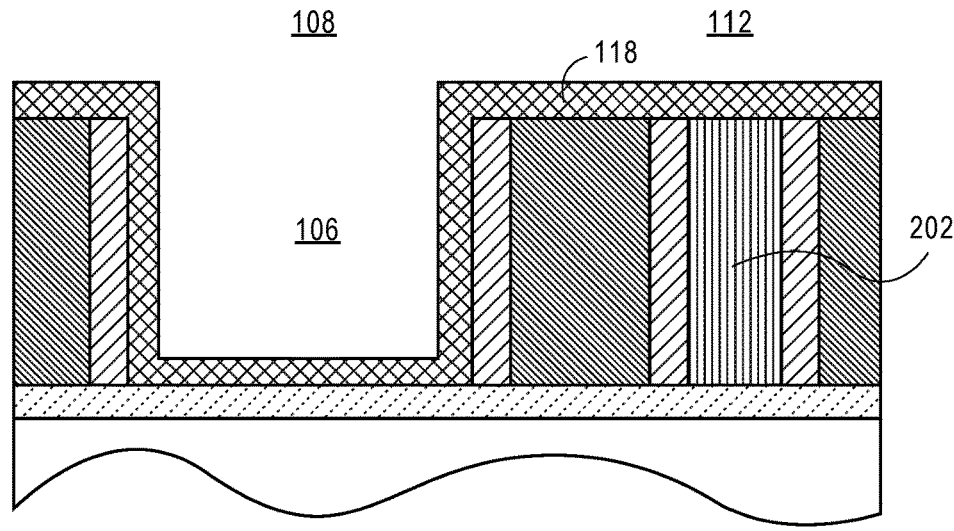

Referring to FIG. 2C, a first conformal gate dielectric layer 118 is formed in the gate trenches 106 of the I/O region 108 and over the sacrificial hardmask layer 202. However, the sacrificial hardmask layer 202 blocks the first conformal gate dielectric layer 118 from being formed in the gate trenches 106 of the logic region 112.

In an embodiment, the first conformal gate dielectric layer 118 is formed to a thickness approximately in the range of 1-10 nanometers. In one such embodiment, the first conformal gate dielectric layer 118 is formed to a thickness approximately in the range of 2.5-3.5 nanometers. In an embodiment, the first conformal gate dielectric layer 118 is a silicon oxide layer. In an embodiment, the first conformal gate dielectric layer 118 is formed using atomic layer deposition (ALD), however, in another embodiment, the first conformal gate dielectric layer 118 is formed using chemical vapor deposition (CVD). In an embodiment, the first conformal gate dielectric layer 118 is formed using a relatively lower-temperature oxide deposition. In one such embodiment, the first conformal gate dielectric layer 118 is formed at a temperature that the sacrificial hardmask layer 202 can withstand without decomposition. In an embodiment, the deposition process of the first conformal gate dielectric layer 118 is compatible, e.g., does not degrade, the sacrificial hardmask layer 202.

Figure 2D:
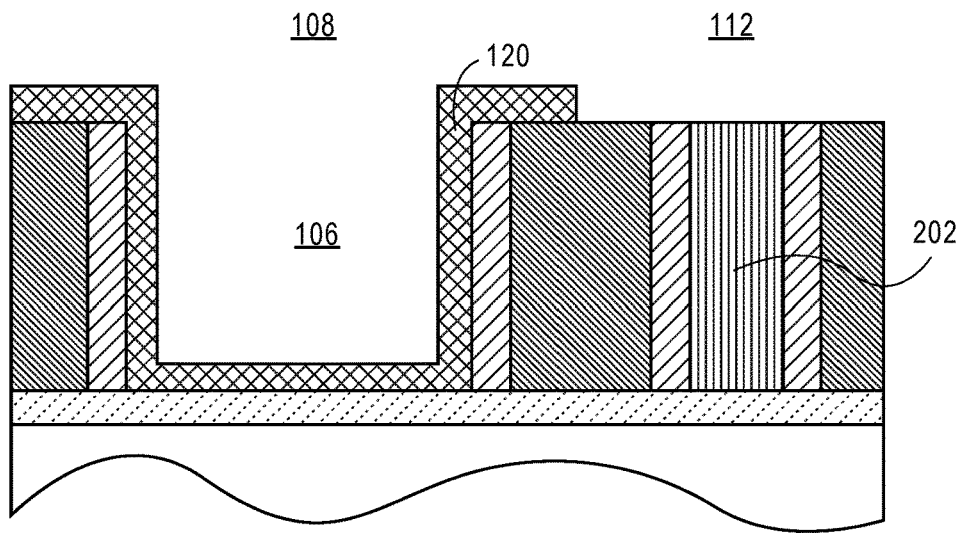

Referring to FIG. 2D, portions of the first conformal gate dielectric layer 118 above the sacrificial hardmask layer 202 are removed to form a patterned first conformal gate dielectric layer 120, e.g., using a masking and etch process. The patterned first conformal gate dielectric layer 120 is retained in the gate trenches 106 of the I/O region 108, but is patterned in a manner to re-expose the logic region 112.

Figure 2E:
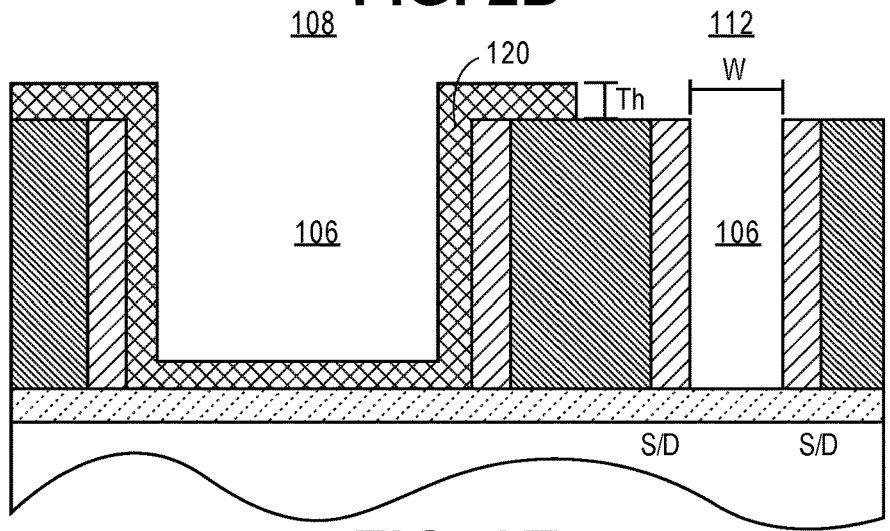

Referring to FIG. 2E, the sacrificial hardmask layer 202 is removed to re-expose the gate trenches 106 in the logic region 112. In an embodiment, the re-exposed the gate trench 106 in the logic region 112 has a width (W) between spacers 116. The width (W) may be defined as the shortest lateral width of the logic gate structure which, in an example is from source/drain (S/D) to source/drain (S/D), as is depicted. In a specific embodiment, the shortest lateral width (W) of the logic gate structure (which does not include the first conformal dielectric layer 118, is approximately three times or less than a thickness (Th) of the first conformal dielectric layer 118 or the patterned first conformal dielectric layer 120. In an embodiment, the sacrificial hardmask layer 202 is removed using an ashing process. In an embodiment, the portions of the first conformal gate dielectric layer 118 above the sacrificial hardmask layer 202 are removed to form the patterned first conformal gate dielectric layer 120 in a separate etching process than used to remove the sacrificial hardmask layer 202. In another embodiment, the portions of the first conformal gate dielectric layer 118 above the sacrificial hardmask layer 202 are removed to form the patterned first conformal gate dielectric layer 120 in a same etching process used to remove the sacrificial hardmask layer 202.

Figure 2F:
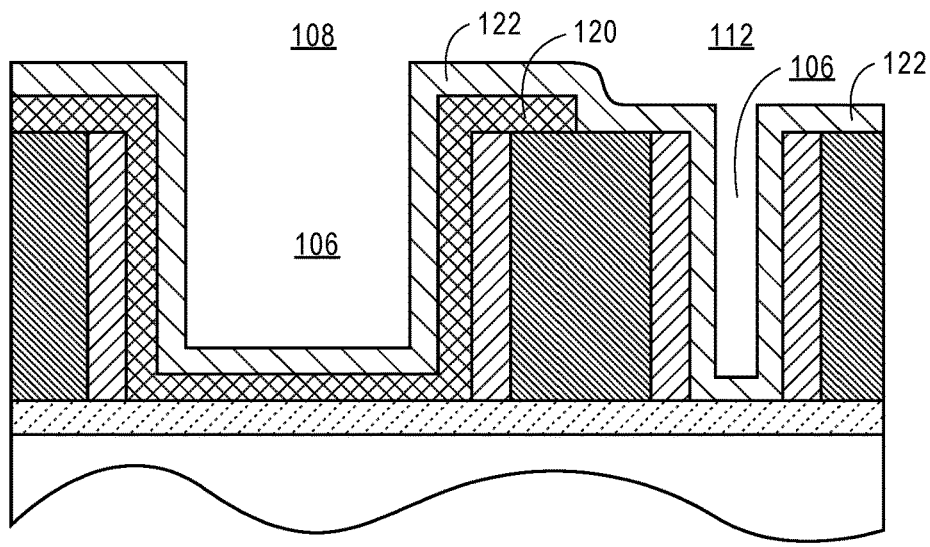

Referring to FIG. 2F, a second conformal gate dielectric layer 122 is formed in the gate trenches 106 of the I/O region 108 and the logic region 112. The second conformal gate dielectric layer 122 is formed on the patterned first conformal gate dielectric layer 120 in the gate trenches 106 in the I/O region 108. In an embodiment, the second conformal gate dielectric layer 122 is formed to a thickness approximately in the range of 1-2 nanometers. In an embodiment, the second conformal gate dielectric layer 122 includes a high-k dielectric material. In an embodiment, the second conformal gate dielectric layer 122 is formed using atomic layer deposition (ALD). Thus, in an embodiment, low voltage transistors in logic region 112 include the second conformal gate dielectric layer 122 but not the first conformal gate dielectric layer 118 (or the patterned first conformal gate dielectric layer 120), while high voltage transistors in the I/O region 108 include both the second conformal gate dielectric layer 122 and the first conformal gate dielectric layer 118 (i.e., the patterned first conformal gate dielectric layer 120).

In an embodiment, subsequent to forming the second conformal gate dielectric layer 122, a gate electrode material is formed in the gate trenches 106 of both the I/O region 108 and the logic region 112. The processing may involve typical replacement gate process involving deposition of conductive material and ultimate planarization of gate electrode and gate dielectric materials to confine the gate electrode and gate dielectric materials to the gate trenches 106. In an embodiment, a high voltage device is ultimately formed in the I/O region 108, while a low voltage device is ultimately formed in the logic region 112.

Referring to one exemplary approach covered in FIGS. 2A-2F, in an embodiment, a processing scheme involves first filling I/O and logic gates locations with a sacrificial hardmask, and then patterning the sacrificial hardmask to open the high-voltage oxide areas. Subsequently, an HV oxide is deposited, which only fills the wider HV gates due to the presence of the sacrificial hardmask in the logic gates. Finally, a second patterning is used to expose the logic gates to remove the HV oxide and strip the sacrificial hardmask.

It is to be appreciated that the gate trenches 106 may expose one or a plurality of semiconductor fins. As an example, FIGS. 3A-3D illustrate angled cross-sectional views representing various operations in a method of fabricating a semiconductor structure having a dual gate dielectric architecture, in accordance with an embodiment of the present invention.

Figure 3A:
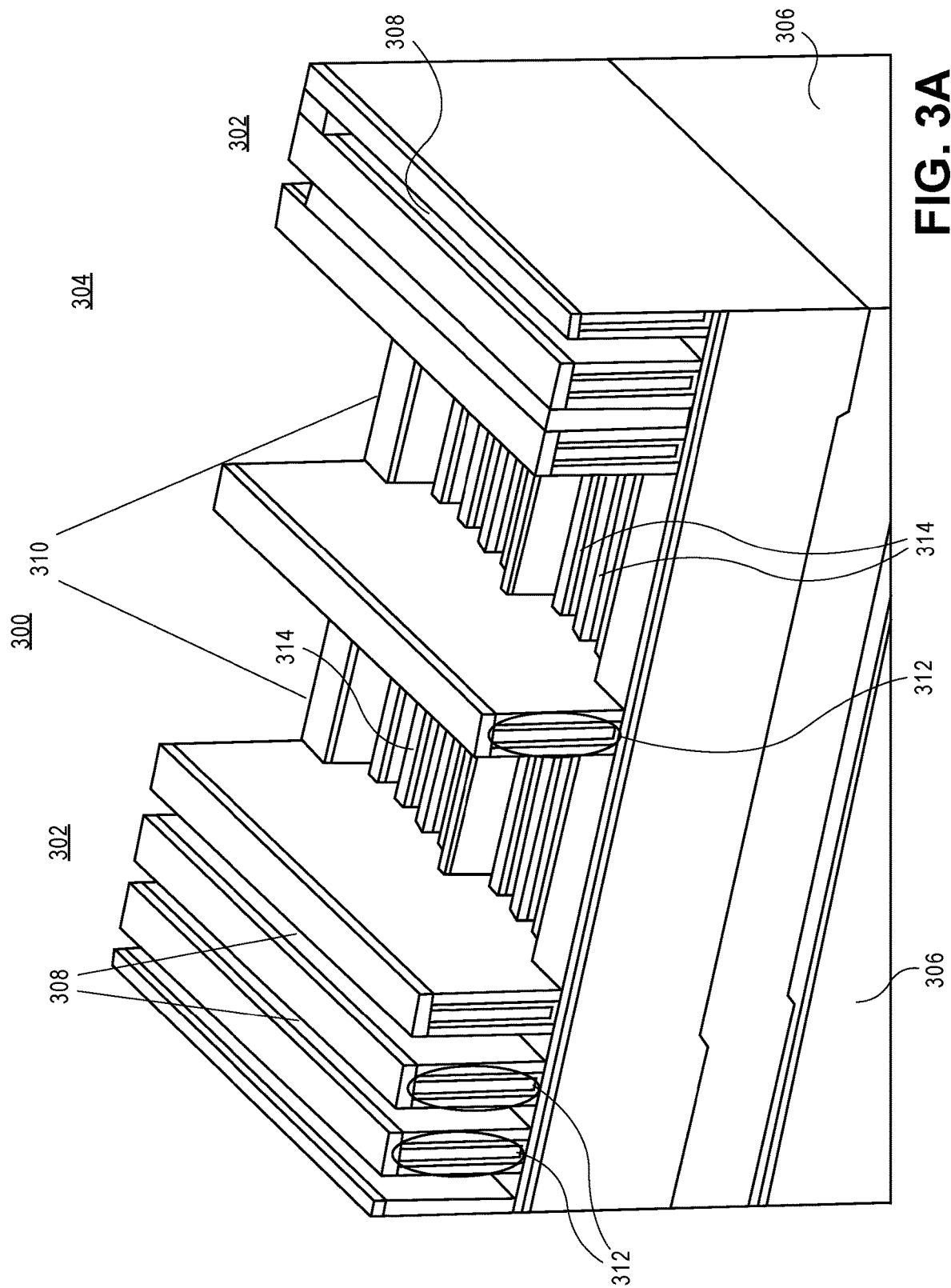
FIGS. 3A-3D illustrate angled cross-sectional views representing various operations in a method of fabricating a semiconductor structure having a dual gate dielectric architecture, in accordance with an embodiment of the present invention.

Referring to FIG. 3A, a starting structure 300 is shown as incoming to replacement gate processing following removal of dummy gate stacks from gate locations. In particular, starting structure 300 includes logic device regions 302 and wide, high voltage device region 304 above a substrate 306. Relatively narrow open logic gate trenches 308 and relatively wide open high-voltage gate trenches 310 are exposed and are separated by dielectric structures 312 which may include ILD material and/or dielectric spacer material. The trenches 308 and 310 expose semiconductor fins 314.

Figure 3B:
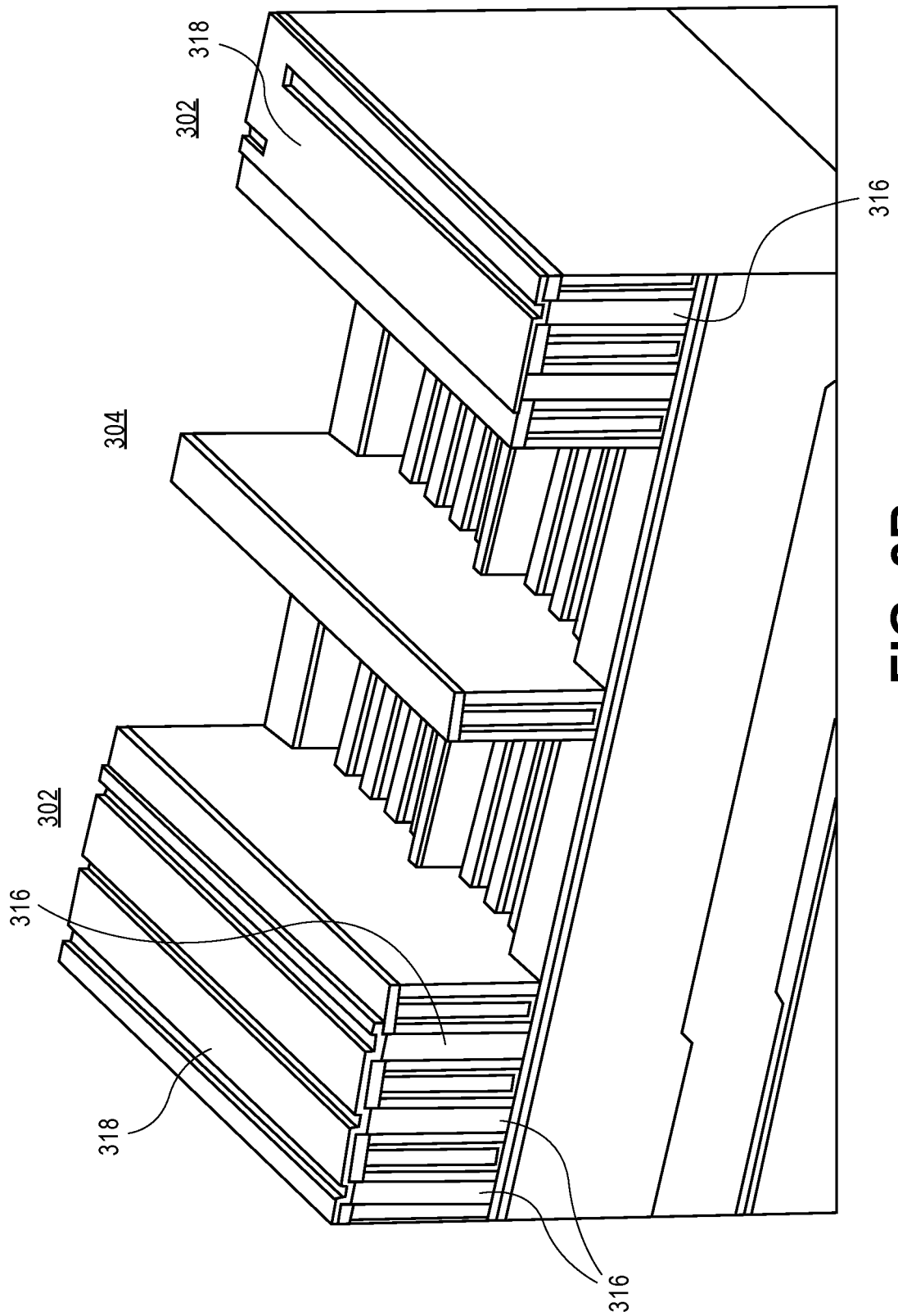

Referring to FIG. 3B, a sacrificial hardmask film 316 is formed and patterned to remain in the narrow logic gate trenches 308 but not in the wide high-voltage gate trenches 310. The sacrificial hardmask film 316 may be patterned using a mask layer 318 which may be patterned using a lithographic and etch patterning process.

Figure 3C:
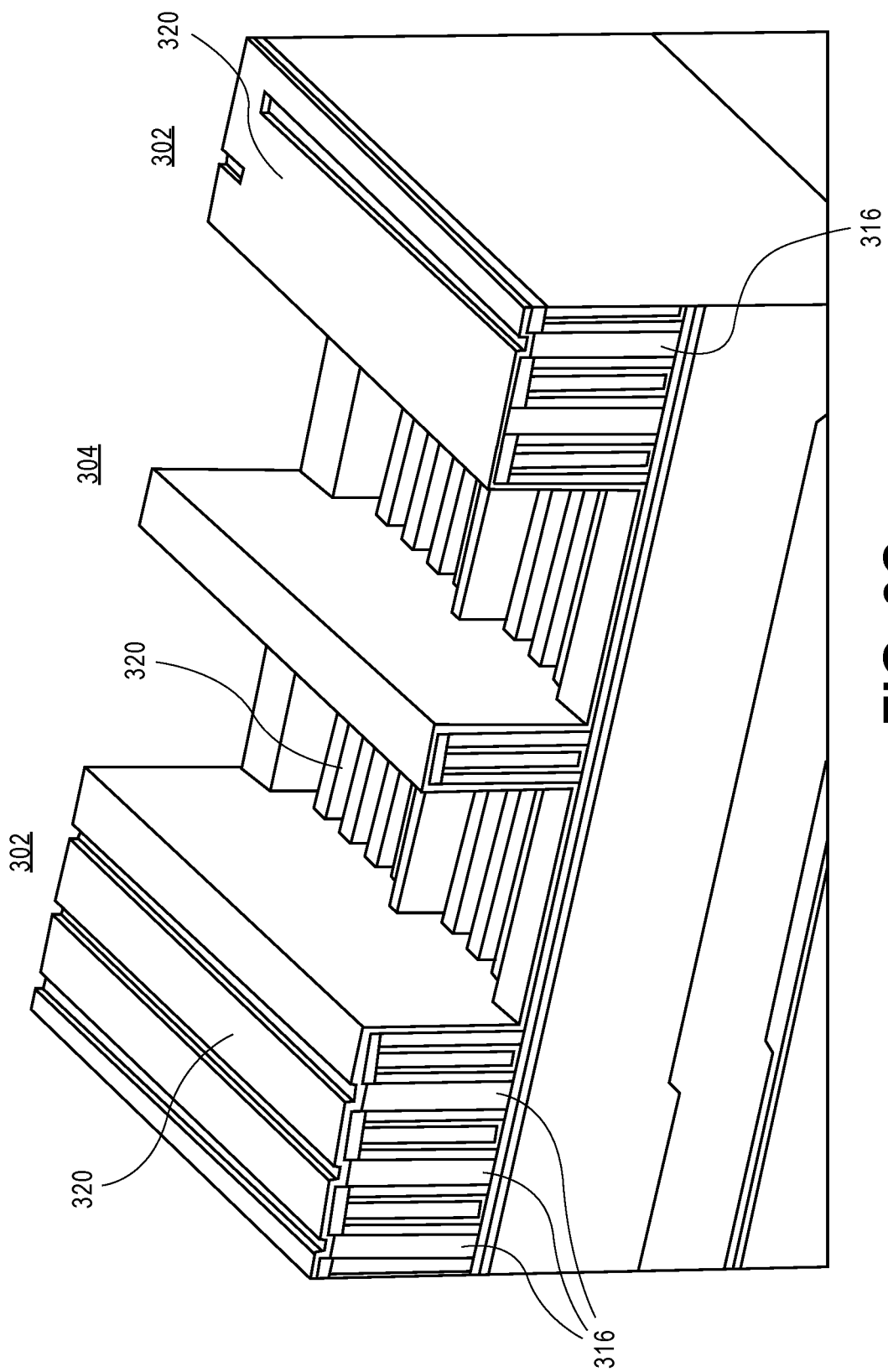

Referring to FIG. 3C, the mask layer 318 is removed and a high voltage oxide layer 320 is deposited conformal with the wide high-voltage gate trenches 310. The high voltage oxide layer 320 is not formed in the narrow logic gate trenches 308, but rather is formed on the sacrificial hardmask film 316, which prevents deposition in the narrow logic gate trenches 308. In an embodiment, as compared with a thermal $SiO_2$ process which would utilize fin 314 consumption to fabricate a thick oxide layer, deposition of the high voltage oxide layer 320 consumes little to none of the material of the fins 314.

Figure 3D:
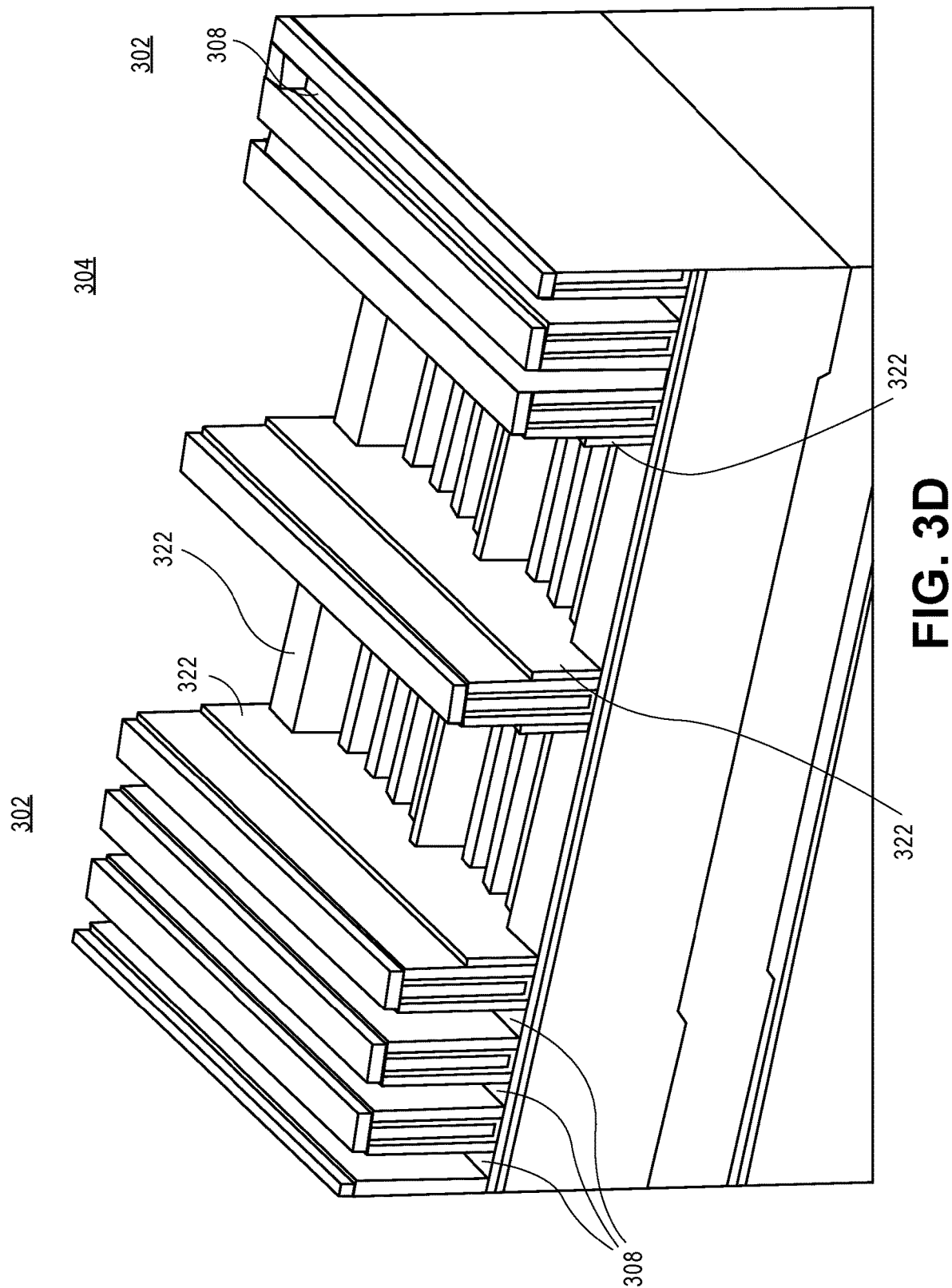

Referring to FIG. 3D, the high voltage oxide layer 320 is patterned to form patterned high voltage oxide layer 322 which is confined to wide high-voltage gate trenches 310. In an embodiment, the patterned to form patterned high voltage oxide layer 322 is conformal with the full height of the wide high-voltage gate trenches 310. In another embodiment, the wide high-voltage gate trenches 310 is recessed partially in to the wide high-voltage gate trenches 310. The sacrificial hardmask film 316 is also removed to re-expose the trenches 308 of the logic regions 302.

In an embodiment, subsequent to removing the sacrificial hardmask film 316, a second conformal gate dielectric layer is formed in all gate trenches. In the I/O regions, the second conformal gate dielectric layer is formed conformal with the patterned high voltage oxide layer 322. In one embodiment, the second conformal gate dielectric layer is formed conformal with a patterned high voltage oxide layer that is conformal with the full height of the wide high-voltage gate trenches 310. In another embodiment, the second conformal gate dielectric layer is formed conformal with a patterned high voltage oxide layer that is recessed partially in to the wide high-voltage gate trenches 310 and, as such, may be ultimately be retained at a height in trenches 310 that is higher than the height of the patterned high voltage oxide layer 322.

Subsequent, to forming a second conformal gate dielectric layer, a gate electrode material may be formed in the gate trenches 308 and 310. The processing may involve typical replacement gate process involving deposition of conductive material and ultimate planarization of gate electrode and gate dielectric materials to confine the gate electrode and gate dielectric materials to the gate trenches 308 and 310. In an embodiment, high voltage device are ultimately formed in the I/O regions 304, while low voltage device are ultimately formed in the logic region 302.

It is to be appreciated that the structures resulting from the above exemplary processing schemes may be used in a same or similar form for subsequent processing operations to complete device fabrication, such as fabrication of a high voltage or I/O device and a logic device on a same die. As an example of completed devices, FIG. 4 illustrates a cross-sectional view of non-planar semiconductor devices having a dual gate dielectric architecture, in accordance with an embodiment of the present invention. FIG. 5 illustrates a plan view taken along the a-a' axis of the semiconductor device of FIG. 4 and a plan view taken along the b-b' axis of the semiconductor device of FIG. 4, in accordance with an embodiment of the present invention.

Referring to FIG. 4, a semiconductor structure 400 includes non-planar active regions (e.g., fin structures each including a protruding fin portion 404 and a sub-fin region 405) formed from substrate 402, and within a trench isolation layer 406. In an embodiment, the fin structures are a plurality of fin lines that form a grating structure such as a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, grating-like fin patterns may have lines spaced at a constant pitch and having a constant width. The pattern may be fabricated by a pitch halving or pitch quartering, or other pitch division, approach.

In an embodiment, the semiconductor structure includes a logic region having a relatively low voltage logic device 420A and an I/O or relatively high voltage (HV) region having an HV device 420B. Gate structures 408 of each of the logic device 420A and the HV device 420B are disposed over the protruding portions 404 of the non-planar active regions as well as over a portion of the trench isolation layer 406 of each of the respective logic region and I/O or high voltage (HV) region. As shown, gate structures 408 include a gate electrode 450 and a gate dielectric layer (gate dielectric 452 for logic device 420A), and gate dielectric 452A/452B for HV device 420B. In one embodiment, each gate structure 408 also includes a dielectric cap layer 454, as is depicted. A gate contact 414 and overlying gate contact via 416 for each device 420A and 420B are also shown from this perspective, along with a respective overlying metal interconnect 460, all of which are disposed in inter-layer dielectric stacks or layers 470.

Referring to FIG. 5, the gate structures 408 for each device 420A and 420B are shown as disposed over the protruding fin portions 404. In an embodiment, although not shown, each of the gate structures 408 form one line of a plurality of parallel gate lines that form a grating structure such as a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, grating-like gate patterns may have lines spaced at a constant pitch and having a constant width. The pattern may be fabricated by a pitch halving or pitch quartering, or other pitch division, approach.

Referring again to FIG. 5, source and drain regions 404A and 404B of the protruding fin portions 404 are shown in this perspective, although it is to be appreciated that these regions would be overlapped with trench contact structures. In one embodiment, the source and drain regions 404A and 404B are doped portions of original material of the protruding fin portions 404. In another embodiment, the material of the protruding fin portions 404 is removed and replaced with another semiconductor material, e.g., by epitaxial deposition. In either case, the source and drain regions 404A and 404B may extend below the height of trench isolation layer 406, i.e., into the sub-fin region 405.

In an embodiment, the semiconductor structure 400 includes non-planar devices such as, but not limited to, finFET devices or tri-gate devices. In such an embodiment, a corresponding semiconducting channel region is composed of or is formed in a three-dimensional body. In one such embodiment, the gate structures 408 surround at least a top surface and a pair of sidewalls of the three-dimensional body.

Substrate 402 may be composed of a semiconductor material that can withstand a manufacturing process and in which charge can migrate. In an embodiment, substrate 402 is a bulk substrate composed of a crystalline silicon, silicon/germanium or germanium layer doped with a charge carrier, such as but not limited to phosphorus, arsenic, boron or a combination thereof, to form active region 404. In one embodiment, the concentration of silicon atoms in bulk substrate 402 is greater than 97%. In another embodiment, bulk substrate 402 is composed of an epitaxial layer grown atop a distinct crystalline substrate, e.g. a silicon epitaxial layer grown atop a boron-doped bulk silicon mono-crystalline substrate. Bulk substrate 402 may alternatively be composed of a group III-V material. In an embodiment, bulk substrate 402 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 402 is composed of a III-V material and the charge-carrier dopant impurity atoms are ones such as, but not limited to, carbon, silicon, germanium, oxygen, sulfur, selenium or tellurium.

Trench isolation layer 406 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the trench isolation layer 406 is composed of a dielectric material such as, but not limited to, silicon dioxide, silicon oxy-nitride, silicon nitride, or carbon-doped silicon nitride.

Gate structures 408 may be composed of a gate electrode stack which includes a gate dielectric layer 452 or 452A/452B and a gate electrode layer 450. In an embodiment, the gate structure 408 of the logic device 420A includes a metal gate 450 and a high-K gate dielectric layer 452. The gate structure 408 of the HV device 420B includes a metal gate 450, a high voltage oxide (e.g., ALD or CVD-deposited $SiO_2$, as described below) and a high-K gate dielectric layer 452B. In one such embodiment, the high-K gate dielectric layer 452 of the logic device 420A and the high-K gate dielectric layer 452B of the HV device are composed of a same material and, in a particular embodiment, are formed in a same deposition operation. Thus, in an exemplary embodiment, the gate structure 408 of logic device 420A includes a gate dielectric 452 conformal with a first plurality of semiconductor fins 404. The gate stack 408 of the HV device 420B includes a gate dielectric 452A/452B conformal with a second plurality of semiconductor fins. In one embodiment, the gate dielectric gate dielectric 452A/452B is thicker than the gate dielectric 452, as is depicted in FIG. 4.

In an embodiment, the gate dielectric layers 452 and 452B are composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer 452 (but not gate dielectric layer 452B) may include a layer of native oxide formed from the top few layers of the substrate 402. In other embodiments, however, gate dielectric layer 452 does not include such a layer of native oxide. In one embodiment, each of the gate dielectric layers 452 and 452B has a thickness approximately in the range of 1-2 nanometers. In one embodiment, each of the gate dielectric layers 452 and 452B consists of a "U"-shaped structure that includes a bottom portion substantially parallel to the surface of the substrate and two sidewall portions that are substantially perpendicular to the top surface of the substrate.

In an embodiment, the gate dielectric of HV device 420B includes an additional dielectric layer 452A in addition to a layer of high-k material 452B. The additional dielectric layer 452A may be a layer of non-native silicon oxide (e.g., $SiO_2$) formed using an atomic layer deposition (ALD) process, a chemical vapor deposition (CVD) process or other conformal oxide liner deposition. In one embodiment, the additional dielectric layer 452A has a thickness approximately in the range of 1-10 nanometers and, in a particular embodiment, 2.5-3.5 nanometers. In one embodiment, the additional dielectric layer 452A consists of a "U"-shaped structure that includes a bottom portion substantially parallel to the surface of the substrate and two sidewall portions that are substantially perpendicular to the top surface of the substrate.

In one embodiment, the gate electrode 450 of gate structure 408 of logic device 420A or HV device 420B, or both, is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

Referring again to FIGS. 4 and 5, in an embodiment, a semiconductor structure 400 includes a first semiconductor fin (one of the fins 404 of the I/O region) and a second semiconductor fin (one of the fins 404 of the logic region) above a substrate 402. A first gate structure (gate structure 408 of the I/O region) includes a first gate electrode 450 over a top surface and laterally adjacent to sidewalls of the first semiconductor fin. A first gate dielectric layer 452A is between the first gate electrode 450 and the first semiconductor fin and along sidewalls of the first gate structure 450. A second gate dielectric layer 452B is between the first gate electrode 450 and the first gate dielectric layer 452A and along the portions of the first gate dielectric layer 452A along the sidewalls of the first gate electrode 450. A second gate structure (gate structure 408 of the logic region) includes a second gate electrode 450 over a top surface and laterally adjacent to sidewalls of the second semiconductor fin. A gate dielectric layer 452 is between the second gate electrode 450 and the second semiconductor fin and along sidewalls of the second gate electrode 450.

In an embodiment, the second gate structure (gate structure 408 of the logic region) does not include the first gate dielectric layer 452A. In an embodiment, the gate dielectric layer 452 is a same layer as the second gate dielectric layer 452B of the first gate structure (gate structure 408 of the I/O region). In an embodiment, a shortest lateral width of the second gate structure (gate structure 408 of the logic region) is approximately three times or less than a thickness of the first dielectric layer 452A, as described in association with FIG. 2E.

Although not depicted in FIGS. 4 and 5, in an embodiment, sidewall spacers are associated with the gate electrode stacks, such as sidewall spacers 116 described in association with FIGS. 2A-2F. Such sidewall spacers may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride. In an embodiment, such a dielectric sidewall spacer laterally surrounds the gate structure 408, e.g., laterally surrounds gate electrode 450 and gate dielectric 452 or laterally surrounds gate electrode 450 and gate dielectric 452A/452B of the respective gate structures 408 of logic device 420A and HV device 420B.

Gate contact 414, overlying gate contact via 416, and overlying metal interconnect 460 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material). A common example is the use of copper structures that may or may not include barrier layers (such as Ta or TaN layers) between the copper and surrounding ILD material. As used herein, the term metal includes alloys, stacks, and other combinations of multiple metals. For example, the metal interconnect lines may include barrier layers, stacks of different metals or alloys, etc.

In an embodiment (although not shown), providing structure 400 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate structures 408 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 400. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 4, in an embodiment, the contact structures of the devices 420A and 420B are formed over an isolation region. It is to be appreciated, however, that in other embodiments the semiconductor devices have contact structures that contact portions of a gate electrode formed over an active region. In one such embodiment, prior to (e.g., in addition to) forming a gate contact structure (such as a via) over an active portion of a gate and in a same layer as a trench contact via, one or more embodiments of the present invention include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers may be formed by CVD, PVD, or by other deposition methods.

In an embodiment, as is also used throughout the present description, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Overall, the difficulty of high-voltage and/or analog circuitry scaling may become more and more evident as the pitches continue to decrease and become discretized due to patterning restrictions. The above described implementation may be useful for a process that implements multiple voltage supplies in circuit designs, e.g., in SoC products at the 14 nm node or less. One or more embodiments described herein may address issues surrounding enablement of a dual-voltage technology on an aggressively scaled non-planar (e.g., three-dimensional) transistor architecture. As Moore's law dictates, a gate pitch should be scaled by a factor of approximately 0.7 each generation in order to meet transistor density requirements. A result of such pitch scaling may be that isolation thickness between a gate contact and source/drain contacts is reduced each generation. System-on-chip (SoC) technologies typically rely on utilizing multiple voltage rails to enable a needed collateral, particularly if analog and/or RF communication features are present. However, conventional fabrication approaches may not be able to support such high voltages on highly scaled process technologies.

More generally, embodiments described herein may be implemented to support multi-gate SoC process nodes at scaled dimensions. In particular, as technologies continue to shrink the critical dimension (CD) of the logic CDs, the oxide required for the high-voltage device will likely fully fill the logic gates. Embodiments described herein may be implemented to enable SoC technologies to continue to scale logic dimensions while retaining high voltage integration. Such may be a fundamental requirement for SoC process technologies.

More specifically, high voltage transistors on aggressively scaled technologies may undergo premature device failure between the gate and source/drain contact, rather than the desirable gate to substrate mechanism. Such premature failure may result from the proximity of the gate to contact separation as well as, possibly, poor insulator qualities of an isolating spacer material.

One solution for enabling a high-voltage device on the 14 nm node may be to substantially relax the pitch (e.g., to enables contacts to be placed farther from the gate). However, a relaxed pitch may not be compatible with scaled densities, yielding undesirable area and cost implications. Accordingly, one or more embodiments described herein enable high voltage gate to source/drain support through the fabrication of a thicker high voltage gate dielectric which includes an ALD- or CVD-based silicon oxide layer deposited between a substrate and a logic-type gate dielectric layer. In a specific embodiment, an approach utilizes a replacement metal gate process flow to provide additional dielectric margin for high voltage devices and corresponding aggressively scaled logic (or other low voltage) devices.

In an embodiment, approaches described above may be implemented to support multi-gate SoC process nodes at scaled dimensions. Approaches described herein may enable SoC technologies to continue to scale logic dimensions while retaining high voltage integration.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 6:
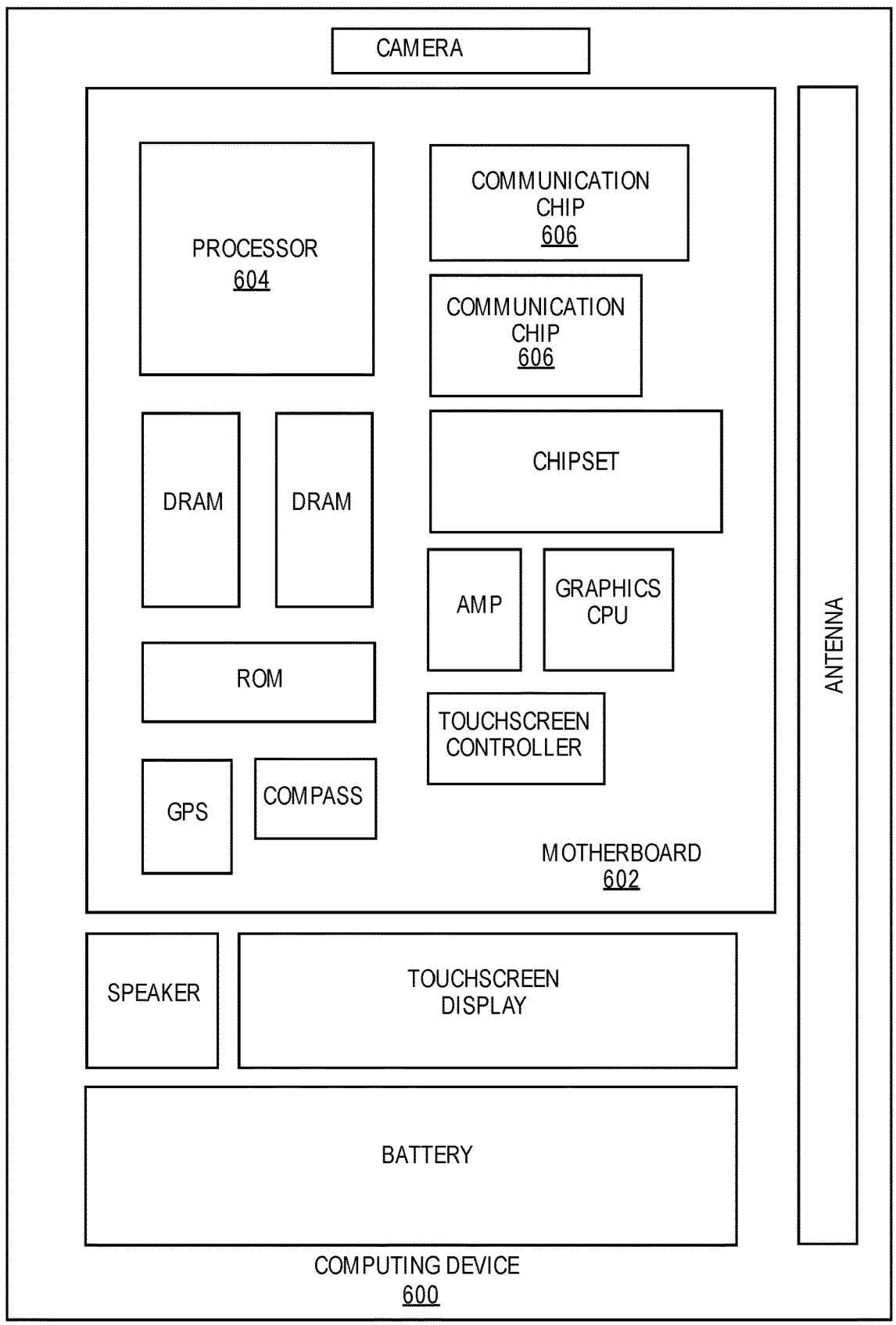
FIG. 6 illustrates a computing device in accordance with one implementation of an embodiment of the invention.

FIG. 6 illustrates a computing device 600 in accordance with one implementation of an embodiment of the present invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. The integrated circuit die of the processor 804 may include one or more structures, such as a semiconductor structure having a dual gate dielectric architecture built in accordance with implementations of embodiments of the present invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. The integrated circuit die of the communication chip 606 may include one or more structures, such as a semiconductor structure having a dual gate dielectric architecture built in accordance with implementations of embodiments of the present invention.

In further implementations, another component housed within the computing device 600 may contain an integrated circuit die that includes one or structures, such as a semiconductor structure having a dual gate dielectric architecture built in accordance with implementations of embodiments of the present invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
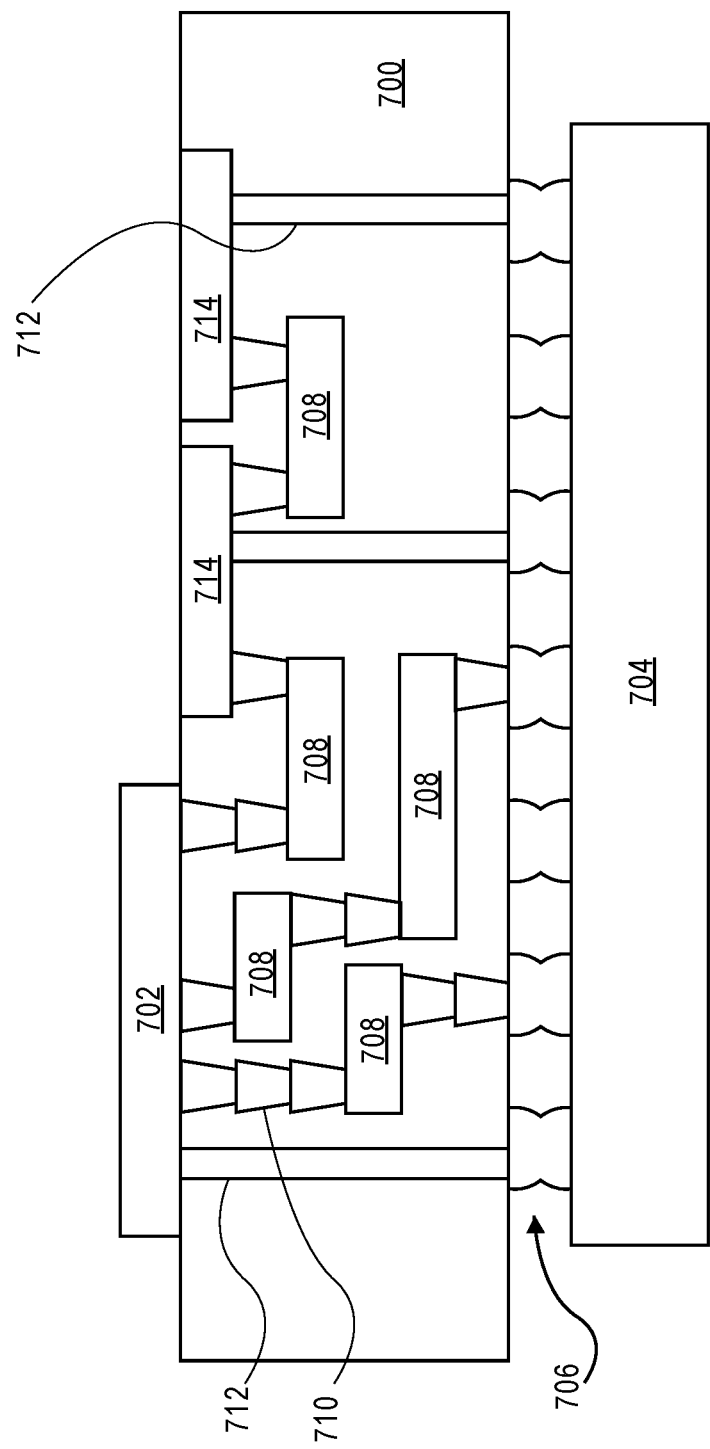
FIG. 7 illustrates an interposer that includes one or more embodiments of the invention.

FIG. 7 illustrates an interposer 700 that includes one or more embodiments of the present invention. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/ 704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the invention, apparatuses or processes disclosed herein may be used in the fabrication of interposer 700 or in the fabrication of components included in the interposer 700.

Thus, embodiments of the present invention include ultra-scaled fin pitch processes having dual gate dielectrics, and the resulting structures.

Example Embodiment 1

A semiconductor structure includes a first semiconductor fin and a second semiconductor fin above a substrate. A first gate structure includes a first gate electrode over a top surface and laterally adjacent to sidewalls of the first semiconductor fin, a first gate dielectric layer between the first gate electrode and the first semiconductor fin and along sidewalls of the first gate structure, and a second gate dielectric layer between the first gate electrode and the first gate dielectric layer and along the portions of the first gate dielectric layer along the sidewalls of the first gate electrode. A second gate structure includes a second gate electrode over a top surface and laterally adjacent to sidewalls of the second semiconductor fin, and the second gate dielectric layer between the second gate electrode and the second semiconductor fin and along sidewalls of the second gate electrode. The second gate structure does not include the first gate dielectric layer, and a shortest lateral width of the second gate structure is approximately three times or less than a thickness of the first dielectric layer.

Example Embodiment 2

The semiconductor structure of example embodiment 1, wherein the first gate dielectric layer has a thickness approximately in the range of 2.5-3.5 nanometers, and wherein the second gate dielectric layer has a thickness approximately in the range of 1-2 nanometers.

Example Embodiment 3

The semiconductor structure of example embodiment 1 or 2, wherein the first gate dielectric layer includes silicon oxide, and the second gate dielectric layer includes a high-k dielectric material.

Example Embodiment 4

The semiconductor structure of example embodiment 1, 2 or 3, wherein the first semiconductor fin and the second semiconductor fin are continuous with the substrate and protrude from the substrate through an insulating layer.

Example Embodiment 5

The semiconductor structure of example embodiment 1, 2, 3 or 4, further including a first dielectric sidewall spacer laterally surrounding the first gate structure, and a second dielectric sidewall spacer laterally surrounding the second gate structure.

Example Embodiment 6

The semiconductor structure of example embodiment 1, 2, 3, 4 or 5, further including a first source region adjacent a first side of the first gate structure, a first drain region adjacent a second side of the first gate structure opposite the first side of the first gate structure, a second source region adjacent a first side of the second gate structure, and a second drain region adjacent a second side of the second gate structure opposite the first side of the second gate structure.

Example Embodiment 7

The semiconductor structure of example embodiment 1, 2, 3, 4, 5 or 6, wherein the first gate structure is a relatively high voltage gate structure, and wherein the second gate structure is a relatively low voltage gate structure.

Example Embodiment 8

The semiconductor structure of example embodiment 1, 2, 3, 4, 5, 6 or 7, wherein the first gate structure is an I/O gate structure, and wherein the second gate structure is a logic gate structure.

Example Embodiment 9

A method of fabricating a semiconductor structure includes forming a first plurality of first fin active regions and a second plurality of fin active regions above a substrate. A first plurality of dummy gate structures and a second plurality of dummy gate structures is formed above the first and second pluralities of fin active regions, respectively. Dielectric spacers are formed adjacent the sidewalls of each of the first plurality of dummy gate structures and each of the second plurality of dummy gate structures. The first and second pluralities of dummy gate structures are removed to form first and second pluralities of gate locations defined by the spacers. A hardmask layer is formed in the second plurality of gate locations. A first conformal gate dielectric layer is formed in the first plurality of gate locations and over the hardmask layer, but not in the second plurality of gate locations. Portions of the first conformal gate dielectric layer above the hardmask layer are removed. The hardmask layer is then removed. Subsequent to removing the hardmask layer, a second conformal gate dielectric layer is formed in the first and second pluralities of gate locations, where the second conformal gate dielectric layer is formed on the first conformal gate dielectric layer in the first plurality of gate locations.

Example Embodiment 10

The method of example embodiment 9, wherein forming the hardmask layer includes forming a blanket material layer in the first and second pluralities of gate locations and then removing the portions of the blanket material layer from the first pluralities of gate locations.

Example Embodiment 11

The method of example embodiment 10, wherein forming the blanket material layer includes depositing the blanket material layer by chemical vapor deposition (CVD) process or by a spin-on process.

Example Embodiment 12

The method of example embodiment 9, wherein forming the hardmask layer includes selectively growing the hardmask layer in the second plurality of gate locations.

Example Embodiment 13

The method of example embodiment 9, 10, 11 or 12, wherein forming the hardmask layer includes forming an insulating layer in the second plurality of gate locations.

Example Embodiment 14

The method of example embodiment 9, 10, 11, 12 or 13, further including, subsequent to forming the second conformal gate dielectric layer, forming a gate electrode material in the first and second pluralities of gate locations.

Example Embodiment 15

The method of example embodiment 9, 10, 11, 12, 13 or 14, further including forming a high voltage device from the first of the plurality of gate locations and a logic device from the second of the plurality of gate locations.

Example Embodiment 16

The method of example embodiment 9, 10, 11, 12, 13, 14 or 15, wherein the first conformal gate dielectric layer is formed to a thickness approximately in the range of 2.5-3.5 nanometers, and wherein the second conformal gate dielectric layer is formed to a thickness approximately in the range of 1-2 nanometers.

Example Embodiment 17

The method of example embodiment 9, 10, 11, 12, 13, 14, 15 or 16, wherein the first conformal gate dielectric layer includes silicon oxide, and the second conformal gate dielectric layer includes a high-k dielectric material.

Example Embodiment 18

The method of example embodiment 9, 10, 11, 12, 13, 14, 15, 16 or 17, wherein the first conformal gate dielectric layer is formed using a first atomic layer deposition (ALD) process, and the second conformal gate dielectric layer is formed using a second atomic layer deposition (ALD) process.

Example Embodiment 19

The method of example embodiment 9, 10, 11, 12, 13, 14, 15, 16, 17 or 18, wherein the portions of the first conformal gate dielectric layer above the hardmask layer and the hardmask layer are removed in a same etching process.

Example Embodiment 20

A semiconductor structure includes an I/O device having a first gate structure in a first trench in a first dielectric spacer above a substrate. The first gate structure includes a first gate dielectric layer, a second gate dielectric layer above the first gate dielectric layer, and a first gate electrode above the second gate dielectric layer. The semiconductor structure also includes a logic device having a second gate structure in a second trench in a second dielectric spacer above the substrate. The second gate structure includes the second gate dielectric layer and a second gate electrode above the second gate dielectric layer. The second gate structure does not include the first gate dielectric layer. A shortest lateral width of the second gate structure is approximately three times or less than a thickness of the first dielectric layer of the first gate structure.

Example Embodiment 21

The semiconductor structure of example embodiment 20, wherein the first gate dielectric layer has a thickness approximately in the range of 2.5-3.5 nanometers, and wherein the second gate dielectric layer has a thickness approximately in the range of 1-2 nanometers.

Example Embodiment 22

The semiconductor structure of example embodiment 20 or 21, wherein the first gate dielectric layer includes silicon oxide, and the second gate dielectric layer includes a high-k dielectric material.

Example Embodiment 23

The semiconductor structure of example embodiment 20, 21 or 22, further including a first source region adjacent a first side of the first gate structure, a first drain region adjacent a second side of the first gate structure opposite the first side of the first gate structure, a second source region adjacent a first side of the second gate structure, and a second drain region adjacent a second side of the second gate structure opposite the first side of the second gate structure.

What is claimed is:

1. A semiconductor structure, comprising:
   a first semiconductor fin and a second semiconductor fin above a substrate;
   a first gate structure comprising a first gate electrode over a top surface and laterally adjacent to sidewalls of the first semiconductor fin, a first gate dielectric layer between the first gate electrode and the first semiconductor fin and along sidewalls of the first gate structure, and a second gate dielectric layer between the first gate electrode and the first gate dielectric layer and along the portions of the first gate dielectric layer along the sidewalls of the first gate electrode; and
   a second gate structure comprising a second gate electrode over a top surface and laterally adjacent to sidewalls of the second semiconductor fin, and the second gate dielectric layer between the second gate electrode and the second semiconductor fin and along sidewalls of the second gate electrode, wherein the second gate structure does not include the first gate dielectric layer, and wherein a shortest lateral width of the second gate structure is approximately three times or less than a thickness of the first dielectric layer.

2. The semiconductor structure of claim 1, wherein the first gate dielectric layer has a thickness approximately in the range of 2.5-3.5 nanometers, and wherein the second gate dielectric layer has a thickness approximately in the range of 1-2 nanometers.

3. The semiconductor structure of claim 1, wherein the first gate dielectric layer comprises silicon oxide, and the second gate dielectric layer comprises a high-k dielectric material.

4. The semiconductor structure of claim 1, wherein the first semiconductor fin and the second semiconductor fin are continuous with the substrate and protrude from the substrate through an insulating layer.

5. The semiconductor structure of claim 1, further comprising:
   a first dielectric sidewall spacer laterally surrounding the first gate structure; and
   a second dielectric sidewall spacer laterally surrounding the second gate structure.

6. The semiconductor structure of claim 1, further comprising:
   a first source region adjacent a first side of the first gate structure;
   a first drain region adjacent a second side of the first gate structure opposite the first side of the first gate structure;
   a second source region adjacent a first side of the second gate structure; and
   a second drain region adjacent a second side of the second gate structure opposite the first side of the second gate structure.

7. The semiconductor structure of claim 1, wherein the first gate structure is a relatively high voltage gate structure, and wherein the second gate structure is a relatively low voltage gate structure.

8. The semiconductor structure of claim 7, wherein the first gate structure is an I/O gate structure, and wherein the second gate structure is a logic gate structure.

9. A semiconductor structure, comprising:
   an I/O device comprising a first gate structure in a first trench in a first dielectric spacer above a substrate, the first gate structure comprising a first gate dielectric layer, a second gate dielectric layer above the first gate dielectric layer, and a first gate electrode above the second gate dielectric layer; and
   a logic device comprising a second gate structure in a second trench in a second dielectric spacer above the substrate, the second gate structure comprising the second gate dielectric layer and a second gate electrode above the second gate dielectric layer, wherein the second gate structure does not include the first gate dielectric layer, and wherein a shortest lateral width of the second gate structure is approximately three times or less than a thickness of the first dielectric layer of the first gate structure.

10. The semiconductor structure of claim 9, wherein the first gate dielectric layer has a thickness approximately in the range of 2.5-3.5 nanometers, and wherein the second gate dielectric layer has a thickness approximately in the range of 1-2 nanometers.

11. The semiconductor structure of claim 9, wherein the first gate dielectric layer comprises silicon oxide, and the second gate dielectric layer comprises a high-k dielectric material.

12. The semiconductor structure of claim 9, further comprising:
- a first source region adjacent a first side of the first gate structure;
- a first drain region adjacent a second side of the first gate structure opposite the first side of the first gate structure;
- a second source region adjacent a first side of the second gate structure; and
- a second drain region adjacent a second side of the second gate structure opposite the first side of the second gate structure.

\* \* \* \* \*